US012757493B2

(12) United States Patent
Luo

(10) Patent No.: US 12,757,493 B2
(45) **Date of Patent: *Oct. 6, 2026**

(54) ARRAY SUBSTRATE, MANUFACTURING METHOD THEREOF, AND DISPLAY PANEL

(71) Applicant: Shenzhen China Star Optoelectronics Semiconductor Display Technology Co., Ltd., Shenzhen (CN)

(72) Inventor: Chuanbao Luo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 408 days.

This patent is subject to a terminal disclaimer.

(21) Appl. No.: 18/496,899

(22) Filed: Oct. 29, 2023

(65) Prior Publication Data

US 2025/0098303 A1 Mar. 20, 2025

(30) Foreign Application Priority Data

Sep. 15, 2023 (CN) ......................... 202311197648.8

(51) Int. Cl.

*H10D 86/60* (2025.01)
*H10D 86/01* (2026.01)
*H10D 86/40* (2025.01)

(52) U.S. Cl.

CPC ........... *H10D 86/60* (2025.01); *H10D 86/021* (2025.01); *H10D 86/441* (2025.01); *H10D 86/421* (2025.01)

(58) Field of Classification Search

CPC .... H10D 86/60; H10D 86/021; H10D 86/441; H10D 86/421; H10H 29/142

See application file for complete search history.

(56) References Cited

U.S. PATENT DOCUMENTS

2013/0240886 A1* 9/2013 Yeh ...................... H10D 86/471 257/57
2020/0052001 A1* 2/2020 Lee ....................... H10F 39/811
2021/0408061 A1* 12/2021 Shin ................... H10K 59/1213
2023/0024248 A1* 1/2023 Luo ........................ H10D 99/00
2023/0178561 A1* 6/2023 Kitagawa ............ G02F 1/13458 257/59

(Continued)

*Primary Examiner* — Galina G Yushina

(74) *Attorney, Agent, or Firm* — PV IP PC; Peter Stecher; Wei Te Chung

(57) ABSTRACT

An array substrate, its manufacturing method, and a display panel are provided. The array substrate includes a substrate, a first active layer, a source-drain layer, a first gate, a second active layer, and a second gate. The first active layer includes a first channel portion corresponding to the first gate. The second active layer includes a second channel portion corresponding to the second gate. The first active layer and the second active layer are connected in parallel. The source-drain layer and the first channel portion are arranged on the surface of a same layer, so an insulating layer between the source-drain layer and the first active layer is omitted. Additionally, the first active layer directly contacts a source contact portion and a drain contact portion of the source-drain layer, so contact holes between the first active layer and the source-drain layer are omitted, simplifying fabrication of the array substrate.

20 Claims, 4 Drawing Sheets

(56) References Cited

U.S. PATENT DOCUMENTS

| | | | | |
|---|---|---|---|---|
| 2023/0187559 | A1 * | 6/2023 | Chen | H10D 64/01<br>257/66 |
| 2024/0153959 | A1 * | 5/2024 | Luo | H10D 86/021 |
| 2024/0222379 | A1 * | 7/2024 | Li | H10D 86/60 |

* cited by examiner

ARRAY SUBSTRATE, MANUFACTURING METHOD THEREOF, AND DISPLAY PANEL

FIELD OF DISCLOSURE

The present application relates to a field of display technology, and in particular to an array substrate, a manufacturing method thereof, and a display panel.

DESCRIPTION OF RELATED ART

The materials commonly used for active layers in thin-film transistors (TFTs) typically include amorphous silicon, low-temperature polysilicon, and oxides. Oxide TFTs, due to their lower leakage current and higher mobility, are widely employed in the display industry for TFT devices.

For currently existing top-gate structured oxide TFTs, their mobility is limited, and therefore, double-gate structures or double active layer structures are often employed to enhance the mobility of oxide TFTs. In the double active layer structure, the source-drain electrodes and active layers usually need to make electrical contact through via holes, which increases the complexity of the manufacturing process.

SUMMARY OF INVENTION

The present application provides an array substrate, a manufacturing method thereof, and a display panel, to address the technical issues of complex manufacturing processes associated with conventional array substrates.

To address the above-mentioned issues, the technical solutions provided in this application are as follows:

The present application provides an array substrate, including:

a substrate;

a first active layer disposed on the substrate and comprising a first channel portion;

a source-drain layer disposed on the substrate, wherein the source-drain layer and the first channel portion are disposed on a surface of a same layer, and the source-drain layer comprises a source contact portion and a drain contact portion separated from each other;

a first gate disposed on one side of the first active layer away from the substrate, wherein the first gate is disposed corresponding to the first channel portion;

a second active layer disposed on one side of the first gate away from the substrate, wherein the second active layer comprises a second channel portion, and the first channel portion and the second channel portion are separated from each other; and a second gate disposed on one side of the second active layer away from the substrate, wherein the second gate is disposed corresponding to the second channel portion;

wherein the first active layer and the second active layer are connected in parallel, and the first active layer directly contacts the source contact portion and the drain contact portion.

In the array substrate of the present application, the first active layer comprises two first doped portions disposed on two sides of the first channel portion; the second active layer comprises two second doped portions disposed on two sides of the second channel portion; the first channel portion is disposed between the source contact portion and the drain contact portion; the two first doped portions make electrical contact with the source contact portion and the drain contact portion, respectively; and the second doped portions are electrically connected to the respectively corresponding first doped portions through first via holes.

In the array substrate of the present application, an ion concentration of the first doped portion is greater than an ion concentration of the second doped portion.

In the array substrate of the present application, a length of the first channel portion is greater than a length of the second channel portion.

In the array substrate of the present application, the array substrate further includes a pixel electrode, wherein the pixel electrode and the second gate are disposed on a surface of a same layer, and wherein the pixel electrode is electrically connected to the first doped portion on the drain contact portion through a second via hole.

In the array substrate of the present application, in a direction from the source contact portion to the drain contact portion, a width of the source contact portion is less than a width of the drain contact portion.

In the array substrate of the present application, the source-drain layer further comprises a first connection terminal and a second connection terminal, and the first connection terminal and the second connection terminal are disposed on one side of the drain contact portion away from the first channel portion; and the array substrate further comprises a third via hole arranged corresponding to the first connection terminal, and one end of the pixel electrode extends into the third via hole and is electrically connected to the first connection terminal.

In the array substrate of the present application, the source-drain layer further comprises a first connection terminal and a second connection terminal, and the first connection terminal and the second connection terminal are disposed on one side of the drain contact portion away from the first channel portion; and the source-drain layer further comprises an electrical connecting component disposed between the drain contact portion and the first connection terminal, and the drain contact portion and the first connection terminal are electrically connected through the electrical connecting component.

In the array substrate of the present application, in a direction from the source contact portion to the drain contact portion, a length of the first channel portion is less than or equal to a width of the first gate.

The present application further provides a display panel, including the array substrate mentioned above and a light-emitting component disposed on one side of the array substrate, wherein the array substrate and the light-emitting component are combined into a single unit.

Advantages: The present application discloses an array substrate, a manufacturing method thereof, as well as a display panel. The array substrate includes a substrate, a first active layer, a source-drain layer, a first gate, a second active layer, and a second gate stacked one above the other. The first active layer includes a first channel portion disposed corresponding to the first gate. The second active layer includes a second channel portion disposed corresponding to the second gate. The first active layer and the second active layer are connected in parallel. The first channel portion and the second channel portion are separated from each other. The source-drain layer and the first channel portion are arranged on the surface of a same layer. The first active layer directly contacts the source contact portion and the drain contact portion of the source-drain layer. By placing the source-drain layer and the first channel portion on the surface of the same layer, this application omits an insulating layer between the source-drain layer and the first active layer. Through direct contact between the first active layer and the source-drain layer's source contact portion and drain contact portion, the present application eliminates a need for contact holes between the first active layer and the source-drain layer, thus simplifying the manufacturing process of the array substrate.

BRIEF DESCRIPTION OF DRAWINGS

A detailed description of the specific embodiments of the present application is provided below in conjunction with the accompanying drawings to make clear the technical solutions and other beneficial effects of the present application.

DETAILED DESCRIPTION OF EMBODIMENTS

The technical solutions of the present application are clearly and completely described below with reference to the accompanying drawings and in conjunction with the embodiments of the present application. Obviously, the described embodiments are only some of the embodiments of the present application, but not all of the embodiments. Based on the embodiments in the present application, all other embodiments obtained by those skilled in the art without making creative efforts fall within the scope of protection of the present application.

Conventional array substrates typically employ a double-gate structure or a double active layer structure to enhance the mobility of oxide TFTs. The improvement in mobility for oxide TFTs with a double-gate structure is typically only 1.4 times that of a single gate, while in the case of a double active layer structure with two stacked active layers, controlling the thickness of each layer proves to be challenging, resulting in poor device uniformity. Therefore, this application provides an array substrate to address the aforementioned technical issues.

Figure 1:
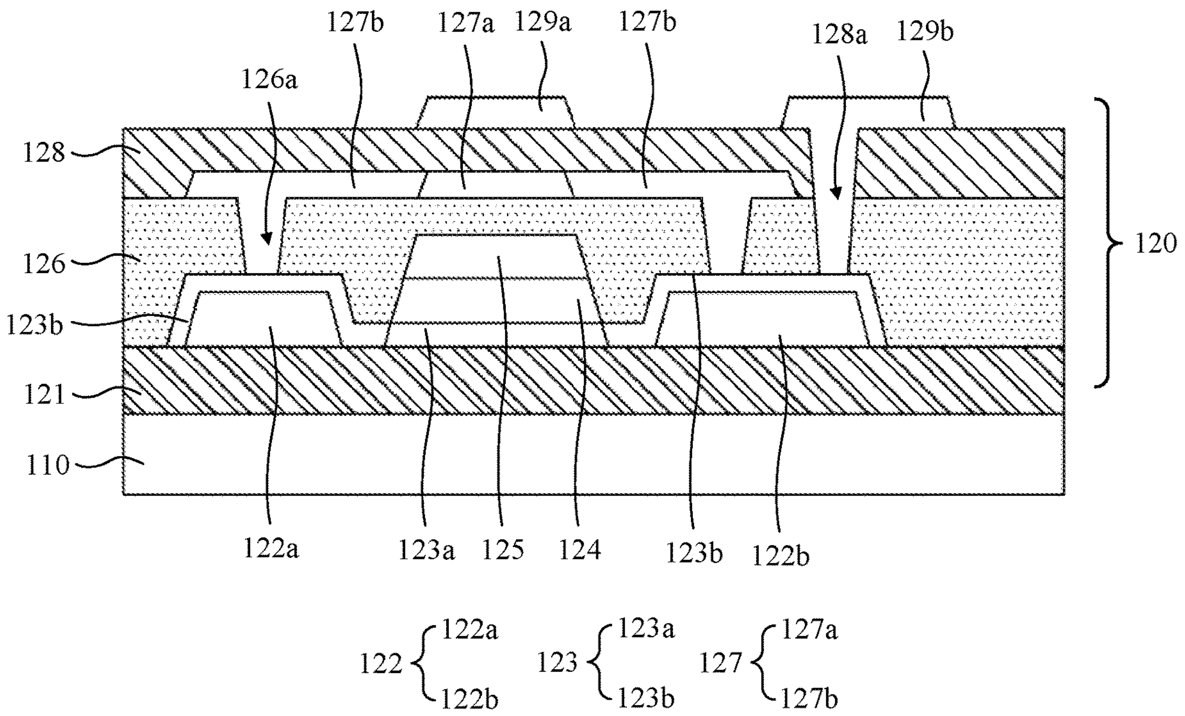
FIG. 1 is a first structural view of an array substrate of the present application.
Figure 2:
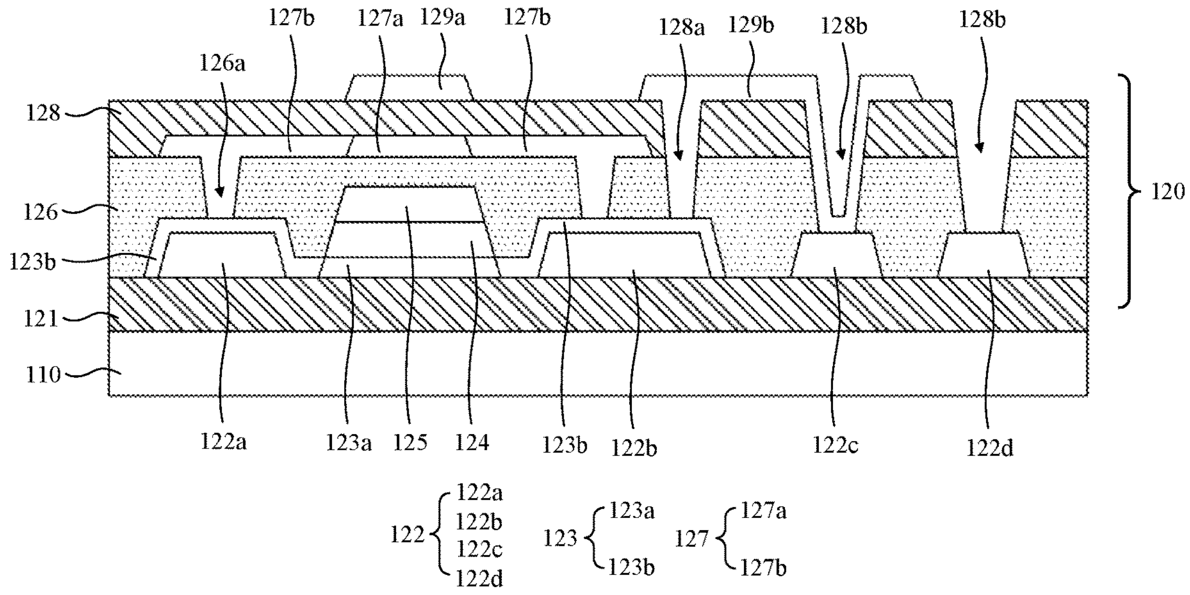
FIG. 2 is a second structural view of the array substrate of the present application.
Figure 3:
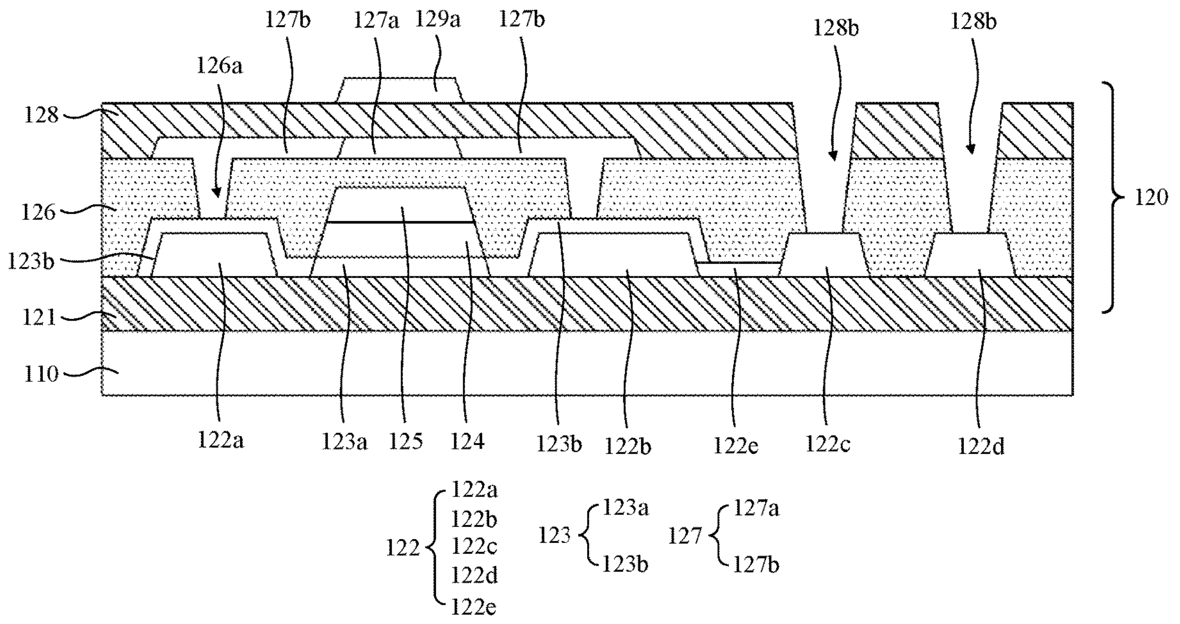
FIG. 3 is a third structural diagram of the array substrate of the present application.

Please refer to FIGS. 1 to 3. The present application provides an array substrate 100 comprising a substrate 110, a first active layer 123, a source-drain layer 122, a first gate 125, a second active layer 127, and a second gate 129*a*. The first active layer 123 and the source-drain layer 122 are disposed on the substrate 110. The first gate 125 is disposed on one side of the first active layer 123 away from the substrate 110. The second active layer 127 is disposed on one side of the first gate 125 away from the substrate 110. The second gate 129*a* is disposed on one side of the second active layer 127 away from the substrate 110.

In the present embodiment, the first active layer 123 includes a first channel portion 123*a*, and the second active layer 127 includes a second channel portion 127*a*. The first gate 125 is disposed corresponding to the first channel portion 123*a*, and the second gate 129*a* is disposed corresponding to the second channel portion 127*a*. The first active layer 123 and the second active layer 127 are connected in parallel, while the first channel portion 123*a* and the second channel portion 127*a* are separated from each other.

In the present embodiment, the source-drain layer 122 can include separately positioned source contact portions 122*a* and drain contact portions 122*b*. The source-drain layer 122 and the first channel portion 123*a* are disposed on a surface of a same layer. The first active layer 123 is in direct contact with the source contact portion 122*a* and the drain contact portion 122*b* of the source-drain layer 122.

By positioning the source-drain layer 122 on the surface of the same layer as the first channel portion 123*a*, the present application eliminates the need for an insulating layer between the source-drain layer 122 and the first active layer 123, as required in conventional techniques, thus saving one deposition process for the insulating layer. Additionally, the first active layer 123 is in direct contact with the source contact portion 122*a* and the drain contact portion 122*b* of the source-drain layer 122. This direct contact allows the first active layer 123 to make direct electrical contact with the source contact portion 122*a* and the drain contact portion 123*b*, eliminating the need for contact holes between the existing first active layer 123 and the source-drain layer 122, as typically required in conventional techniques. This, in turn, reduces one etching process for the contact holes and simplifies the manufacturing process of the array substrate 100.

Please refer to FIGS. 1 to 3. The array substrate 100 can include a substrate 110 and a drive circuit layer 120 disposed on the substrate 110. The drive circuit layer 120 can comprise thin-film transistors, which can be of various types, such as etch stopper type, back-channel etching type, or categorized based on the gate and active layer positioning into bottom-gate thin-film transistors, top-gate thin-film transistors, and similar structures. In the following embodiment, the technical solution of the present application is described using back-channel etching type thin-film transistors as an illustration.

In this embodiment, a material of the substrate 110 can be glass, quartz, or polyimide.

In this embodiment, as shown in FIGS. 1 to 3, the array substrate 100 can include:

- a buffer layer 121, disposed on the substrate 110. A material of the buffer layer 121 can include compounds composed of nitrogen, silicon, and oxygen elements, such as a single layer of silicon oxide film or a silicon oxide-silicon nitride stacked structure.
- a source-drain layer 122, disposed on one side of the buffer layer 121 away from the substrate 110. In this embodiment, a material of the source-drain layer 122 can be a metal like Cr, W, Ti, Ta, Mo, Al, Cu, etc. or alloys composed of at least two of the above-mentioned metals.

The first active layer 123 is disposed on one side of the buffer layer 121 away from the substrate 110. The first active layer 123 includes a first channel portion 123*a* and first doped portions 123*b* located on two sides of the first channel portion 123*a*. A material of the first active layer 123 can be a metal oxide, such as IGZO, IGTO, Ln-IZO, ITZO, ITGZO, HIZO, IZO (InZnO), ZnO:F, $In_2O_3$:Sn, $In_2O_3$:Mo, $Cd_2SnO_4$, ZnO:Al, $TiO_2$:Nb, Cd—Sn—O, or other metal oxides. In the embodiment provided below, IGZO is used as example for illustration. In this embodiment, plasma treatment can be performed on the first active layer 123, so that the first active layer 123 forms the first channel portion 123*a* and the first doped portions 123*b* located on two sides of the first channel portion 123*a*.

In the present embodiment, the first channel portion 123*a* and the source contact portion 122*a* and the drain contact portion 122*b* are all positioned on one side of the buffer layer 121 away from the substrate 110. The first channel portion 123*a* can be located between the source contact portion 122*a* and the drain contact portion 122*b*. Additionally, the two first doped portions 123*b* each make electrical contact with the source contact portion 122*a* and the drain contact portion 122*b*, meaning that the source contact portion 122*a* and the drain contact portion 122*b* are electrically connected to the two first doped portions 123*b*, respectively.

A first gate insulating layer 124 is disposed on one side of the first active layer 123 away from the substrate 110. The first gate insulating layer 124 serves to insulate the upper metal from the first active layer 123. In the present embodiment, a material of the first gate insulating layer 124 can comprise compounds composed of nitrogen, silicon, and oxygen, or aluminum oxide, such as a single layer of silicon oxide or silicon nitride, or a multilayer structure of these inorganic films.

The first gate 125 is disposed on one side of the first gate insulating layer 124 away from the substrate 110. A material of the first gate 125 can be Cr, W, Ti, Ta, Mo, Al, Cu, or etc., or alloys composed of at least two of the above-mentioned metals. A pattern of the first gate 125 matches a pattern of the first gate insulating layer 124. The first gate 125 is disposed corresponding to the first channel portion 123*a*. In other words, an orthographic projection of the first channel portion 123*a* projected on the first gate 125 can be located within the first gate 125 to protect the first channel portion 123*a* from external light.

An interlayer insulating layer 126 is disposed on one side of the first gate 125 away from the substrate 110, and covers the first gate 125 and the first active layer 123 in its entirety. In the present embodiment, a material of the interlayer insulating layer 126 can comprise compounds composed of nitrogen, silicon, and oxygen, such as a single layer of silicon oxide or a multilayer structure of silicon oxide-silicon nitride-silicon oxide. Multiple first via holes 126*a* are formed in the interlayer insulating layer 126 in this embodiment, allowing certain portions of the first doped portions 123*b* to be exposed.

The second active layer 127 is disposed on one side of the interlayer insulating layer 126 away from the substrate 110. The second active layer 127 includes a second channel portion 127*a* and second doped portions 127*b* located on two sides of the second channel portion 127*a*. The first doped portions 123*b* are electrically connected to the respective corresponding second doped portions 127*b* through the first via holes 126*a*. In this embodiment, a material of the second active layer 127 can be the same as the material of the first active layer 123. In this embodiment, ion implantation can be employed to treat the second active layer 127, so that the second active layer 127 forms the second channel portion 127*a* and the second doped portions 127*b* located on two sides of the second channel portion 127*a*.

A second gate insulating layer 128 is disposed on one side of the second active layer 127 away from the substrate 110. The second gate insulating layer 128 serves to insulate the upper metal from the second active layer 127. In this embodiment, a material of the second gate insulating layer 128 can comprise compounds composed of nitrogen, silicon, and oxygen. In this embodiment, the second gate insulating layer 128 covers the second active layer 127 and portions of the interlayer insulating layer 126 that are not covered by the second active layer 127.

The second gate 129*a* is disposed on one side of the second gate insulating layer 128 away from the substrate 110. A pattern of the second gate 129*a* matches a pattern of the second gate insulating layer 128. The second gate 129*a* is disposed corresponding to the second channel portion 127*a*. In other words, an orthographic projection of the second channel portion 127*a* projected on the second gate 129*a* can be located within the second gate 129*a* to protect the second channel portion 127*a* from external light.

In the array substrate 100 of the present application, as shown in FIG. 1, the first doped portions 123*b* are formed using plasma implantation, while the second doped portions 127*b* are formed using ion implantation. The second doped portions 127*b* are disposed on one side of the first doped portions 123*b* away from the substrate 110. Consequently, ions from the second doped portions 127*b* enter the first doped portions 123*b* due to the force of gravity. Therefore, in this embodiment, the first doped portions 123*b* are considered heavily doped regions, and the second doped portions 127*b* are considered lightly doped regions. The ion concentration in the first doped portions 123*b* can be greater than the ion concentration in the second doped portions 127*b*.

Furthermore, because the ion concentration in the first doped portions 123*b* can be greater than the ion concentration in the second doped portions 127*b*, the conductivity rate of the first active layer 123 can be higher than conductivity rate of the second active layer 127. Since the conductivity rate of an active layer is directly proportional to the length of a channel, meaning that a shorter channel allows ions to pass through in less time, resulting in faster conductivity rate, and a longer channel leads to a longer ion transit time and slower conductivity rate. Therefore, to ensure that the conductivity rates of the first active layer 123 and the second active layer 127 are equal, a length of the first channel portion 123*a* can be greater than a length of the second channel portion 127*a*. This reduces a distance between the two second doped portions 127*b*, equalizing the conductivity rates of the first active layer 123 and the second active layer 127. It balances the difference in ion concentration between the first doped portions 123*b* and the second doped portions 127*b*, resolving the technical issue of different turn-on rates between the first active layer 123 and the second active layer 127 and ensuring uniformity in the transmission rate of data signals from different active layers.

In the present embodiment, since the first channel portion 123*a* is only driven by the first gate 125, while the second channel portion 127*a* is simultaneously driven by both the first gate 125 and the second gate 129*a*, the conductivity rate of the first active layer 123 is lower than the conductivity rate of the second active layer 127 when the first doped portions 123*b* and the second doped portions 127*b* have the same ion doping concentration. However, because the ion concentration in the first doped portions 123*b* is higher than the ion concentration in the second doped portions 127*b*, and the impact of ion concentration on the conductivity rate of an active layer is greater than the impact of gate voltage on the conductivity rate of an active layer, the length of the first channel portion 123*a* can be greater than the length of the second channel portion 127*a*.

It should be noted that when the driving voltage of the first gate 125 and the second gate 129*a* reaches a certain value, the effect of voltage on the conductivity rate of the active layer becomes greater than the effect of ion concentration on the conductivity rate of the active layer. Therefore, in the present application, the length of the first channel portion 123*a* can be less than or equal to the length of the second channel portion 127*a*.

Please refer to FIG. 1. The array substrate 100 can further include a pixel electrode 129*b* disposed on one side of the second gate insulating layer 128 away from the substrate 110. Both the pixel electrode 129*b* and the second gate 129*a* can be located on the surface of the second gate insulating layer 128. In the present embodiment, a material of the pixel electrode 129*b* and the second gate 129*a* can be the same, such as transparent metallic materials like indium tin oxide (ITO). This means that the pixel electrode 129*b* and the second gate 129*a* can be formed in the same process step.

In the present embodiment, the pixel electrode 129*b* is electrically connected to the first doped portion 123*b* on the drain contact portion 122*b* through a second via hole 128*a*. These second via hole 128*a* penetrates through the second gate insulating layer 128 and a portion of the interlayer insulating layer 126.

In the present embodiment, the first via hole 126*a* and the second via hole 128*a* are simultaneously provided on the drain contact portion 122*b*. In order to avoid interference between the first via hole 126*a* and the second via hole 128*a*, a width of the drain contact portion 122*b* can be greater than the width of the source contact portion 122*a*. This allows sufficient space on the drain contact portion 122*b* to accommodate both the first via hole 126*a* and the second via hole 128*a* simultaneously.

In the structure shown in FIG. 1, in a direction from the source contact portion 122*a* to the drain contact portion 122*b*, the length of the first channel portion 123*a* is less than or equal to a width of the first gate 125. In the present embodiment, even though during the manufacturing process, the first doped portions 123*b* are formed by ion doping with the first gate 125 serving as a masking layer, due to the fact that the first doped portions 123*b* represent heavily doped regions within the active layer and ions have a certain degree of diffusion, ions from the first doped portions 123*b* tend to diffuse into the first channel portion 123*a*, thus reducing the length of the first channel portion 123*a*. Therefore, in actual products, the length of the first channel portion 123*a* is less than or equal to the width of the first gate 125.

In this embodiment, the structure shown in FIG. 1 can serve as the array substrate 100 for both liquid crystal display panels and organic light-emitting display panels. For example, in the case of liquid crystal display panels, the structure in FIG. 1 can be assembled into a complete panel by mating the structure with a color filter substrate in subsequent processes and injecting liquid crystal material to form a liquid crystal display panel. For organic light-emitting display panels, an organic light-emitting layer and a thin-film encapsulation layer can be directly formed on a layer containing the pixel electrode 129*b* to create an organic light-emitting display panel.

In the structure shown in FIG. 1, the impact of light on the channels of the thin-film transistors can alter the mobility characteristics of the active layer, consequently leading to a certain degree of performance drift of the thin-film transistors. Since the material of the second gate 129*a* is made of a transparent material, a light-shielding layer needs to be provided on the second gate 129*a* to prevent external light from irradiating the second channel portion 127*a*, which affects the conductivity rate of the second active layer 127.

Please refer to FIG. 2. The structure in FIG. 2 is similar to or identical to the structure in FIG. 1, with the following differences:

When the array substrate 100 is used as a backlight or a self-luminous direct display device, the source-drain layer 122 can also include a first connection terminal 122*c* and a second connection terminal 122*d*. The first connection terminal 122*c* and the second connection terminal 122*d* are located on one side of the drain contact portion 122*b* away from the first channel portion 123*a*.

In the present embodiment, the array substrate 100 can also include a third via hole 128*b* corresponding to the first connection terminal 122*c*. One end of the pixel electrode 129*b* extends into the third via hole 128*b* and is electrically connected to the first connection terminal 122*c*. Thus, the first connection terminal 122*c* can be used for connecting a P-pole of the light-emitting device, and the second connection terminal 122*d* can be used for connecting an N-pole of the light-emitting device.

Please refer to FIG. 3, where the structure in FIG. 3 is same or similar to the structure in FIGS. 1 and 2, with the difference being that:

When the array substrate 100 is used as a backlight or self-luminous direct display device, the source-drain layer 122 can also include a first connection terminal 122*c* and a second connection terminal 122*d*. The first connection terminal 122*c* and the second connection terminal 122*d* are located on one side of the drain contact portion 122*b* away from the first channel portion 123*a*.

In the present embodiment, the source-drain layer 122 can also include an electrical connecting component 122*e* located between the drain contact portion 122*b* and the first connection terminal 122*c*. The drain contact portion 122*b* can be electrically connected to the first connection terminal 122*c* via the electrical connecting component 122*e*. Thus, the structure in FIG. 3 can omit the layer of the pixel electrode 129*b*. During the production of the source-drain layer 122, the drain contact portion 122*b* can be directly electrically connected to the first connection terminal 122*c*.

In the present embodiment, the first connection terminal 122*c* can be used to connect the P-pole of the light-emitting device, while the second connection terminal 122*d* can be used to connect the N-pole of the light-emitting device.

To ensure uniformity of a light-emitting backplane in this embodiment, a layer of light-shielding adhesive can be applied to the array substrate 100, covering the array substrate 100 except the light-emitting devices.

In the present embodiment, the light-emitting devices can be LEDs, MiniLEDs, or MicroLEDs.

In the above-described embodiments, the source contact portion 122*a* and the drain contact portion 122*b* can be interchangeable. The distinction between the source contact portion 122*a* and the drain contact portion 122*b* in this application is merely a matter of nomenclature.

The present application further provides a display panel, which includes the aforementioned array substrate 100 and a light-emitting component positioned on one side of the array substrate 100. The array substrate 100 and the light-emitting component are integrated as a single unit.

For instance, when the display panel is a liquid crystal display (LCD) panel, the structure shown in FIG. 1 can serve as an array layer of the LCD panel, while the structures in FIGS. 2 and 3 can serve as a backlight source for the LCD panel, and the light-emitting component can be LEDs of various sizes. Alternatively, when the display panel is a self-luminous display panel, the structure in FIG. 1 can serve as an array layer of the self-luminous display panel, and the structures in FIGS. 2 and 3 can also serve as an array layer of the self-luminous display panel, with the light-emitting component being MiniLEDs or MicroLEDs.

Figure 4:
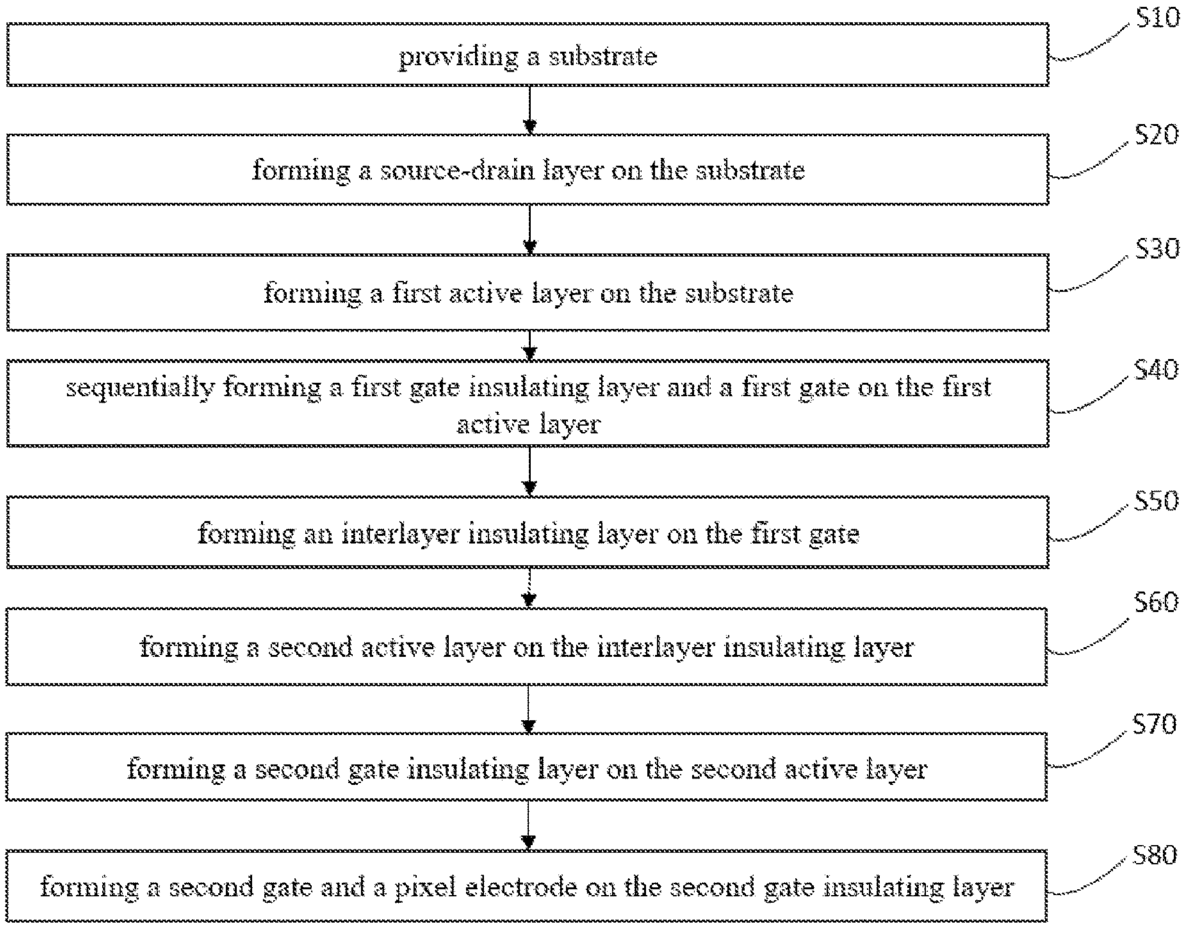
FIG. 4 is a process flow diagram illustrating a manufacturing method of the array substrate of the present application.

Please refer to FIG. 4. The present application provides a manufacturing method of the array substrate 100. The structures in FIGS. 1 to 3 are similar. In the following embodiments, the manufacturing method of the array substrate 100 is described using the structure from FIG. 2 as an example.

In the present embodiment, the manufacturing method of the array substrate 100 includes steps as follows.

S10: providing a substrate 110.

Figure 5A:
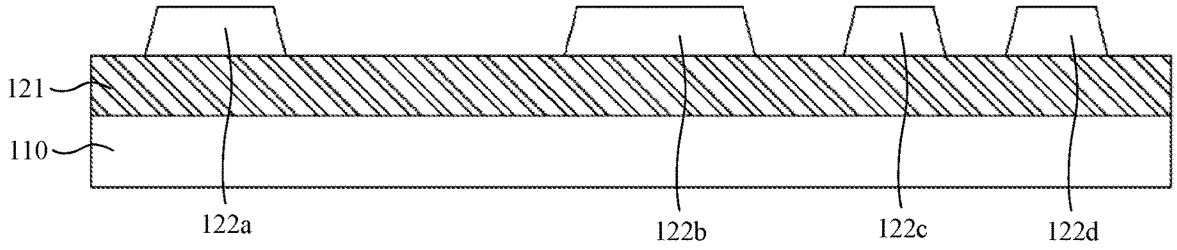
FIGS. 5A to 5F illustrates steps in the process flow diagram of the manufacturing process of the array substrate of the present application.

Please refer to FIG. 5A. A material of the substrate 110 can be glass, quartz, polyimide, or other similar materials.

S20: forming a source-drain layer 122 on the substrate 110.

In this embodiment, step S20 includes:

forming a buffer layer 121 on the substrate 110, and forming the source-drain layer 122 on one side of the buffer layer 121 away from the substrate 110.

In the present embodiment, a material of the buffer layer 121 can consist of a compound composed of nitrogen, silicon, and oxygen. For example, the buffer layer 121 could be a single layer of silicon oxide or a stacked structure of silicon oxide and silicon nitride.

In the present embodiment, the source-drain layer 122 can include separately positioned source contact portion 122*a* and drain contact portion 122*b*. A material of the source-drain layer 122 in this embodiment may include metals such as Cr, W, Ti, Ta, Mo, Al, Cu, or alloys composed of at least two of the mentioned metals.

In the present embodiment, the source-drain layer 122 can also include a first connection terminal 122*c* and a second connection terminal 122*d*. The first connection terminal 122*c* and the second connection terminal 122*d* are disposed on one side of the drain contact portion 122*b* away from the source contact portion 122*a*.

In the present embodiment, the source contact portion 122*a*, the drain contact portion 122*b*, the first connection terminal 122*c*, and the second connection terminal 122*d* are formed in the same photolithographic (photomask) step, which saves one photolithography step.

In the present embodiment, the first connection terminal 122*c* can be used to connect to a P-pole of the light-emitting device, while the second connection terminal 122*d* can be used to connect to an N-pole of the light-emitting device.

S30: forming a first active layer 123 on the substrate 110.

Figure 5B:
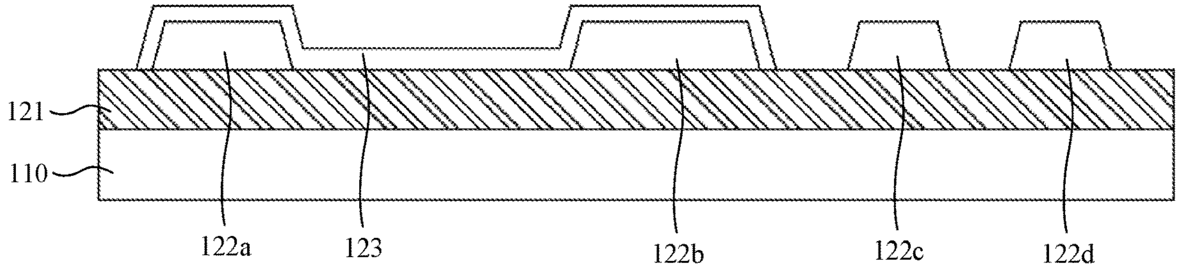

In the present embodiment, as shown in FIG. 5B, the first active layer 123 can be disposed on one side of the buffer layer 121 away from the substrate 110. A material of the first active layer 123 can be metal oxide, such as IGZO, IGTO, Ln-IZO, ITZO, ITGZO, HIZO, IZO(InZnO), ZnO:F, $In_2O_3$:Sn, $In_2O_3$:Mo, $Cd_2SnO_4$, ZnO:Al, $TiO_2$:Nb, Cd—Sn—O, or other metal oxides. The following embodiment uses IGZO as an example for illustration.

S40: sequentially forming a first gate insulating layer 124 and a first gate 125 on the first active layer 123.

Figure 5C:
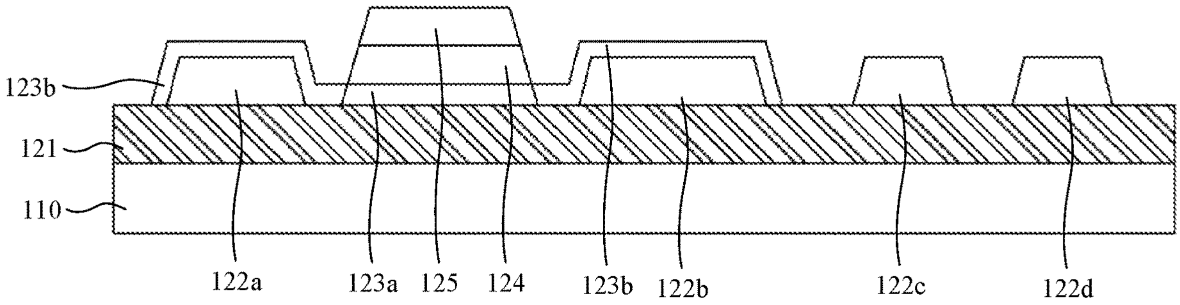

In this embodiment, as shown in FIG. 5C, the first gate insulating layer 124 can be disposed on one side of the first active layer 123 away from the substrate 110. The first gate insulating layer 124 serves to isolate the upper metal layer from the first active layer 123. A material of the first gate insulating layer 124 in this embodiment can comprise compounds of nitrogen, silicon, and oxygen, or aluminum oxide ($Al_2O_3$), such as a single layer of silicon oxide or silicon nitride, or multiple layers of the above-mentioned inorganic film structures.

In the present embodiment, as shown in FIG. 5C, the first gate 125 can be disposed on one side of the first gate insulating layer 124 away from the substrate 110. A material of the first gate 125 can include metals such as Cr, W, Ti, Ta, Mo, Al, Cu, or alloys composed of at least two of the aforementioned metals. A pattern of the first gate 125 matches a pattern of the first gate insulating layer 124.

In the present embodiment, the first gate 125 is used as a masking layer, and plasma processing is performed on the first active layer 123 to create the first channel portion 123*a* and doped portions arranged on two sides of the first channel portion. The first gate 125 is arranged corresponding to the first channel portion 123*a*, meaning that an orthographic projection of the first channel portion 123*a* projected on the first gate 125 can be located within the first gate 125. This protects the first channel portion 123*a* from external light.

S50: forming an interlayer insulating layer 126 on the first gate 125 and forming multiple first via holes 126*a* in the interlayer insulating layer 126 to partially expose the two first doped portions 123*b*.

Figure 5D:
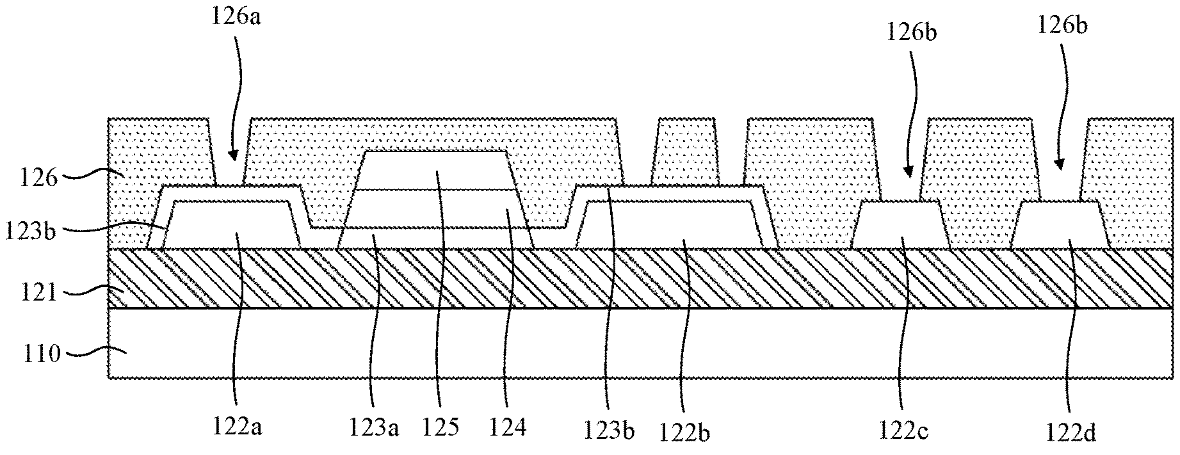

In the present embodiment, as shown in FIG. 5D, the interlayer insulating layer 126 is disposed on one side of the first gate 125 away from the substrate 110. The interlayer insulating layer 126 is laid as a complete layer and covers both the first gate 125 and the first active layer 123 in its entirety. A material of the interlayer insulating layer 126 in this embodiment can be a compound consisting of nitrogen, silicon, and oxygen, such as a single layer of silicon oxide, or a stacked layer structure of silicon oxide-silicon nitride-silicon oxide.

Simultaneously, while forming the first via holes 126*a*, multiple transition holes 126*b* can also be formed to partially expose the first connection terminal 122*c* and the second connection terminal 122*d*.

Figure 5E:
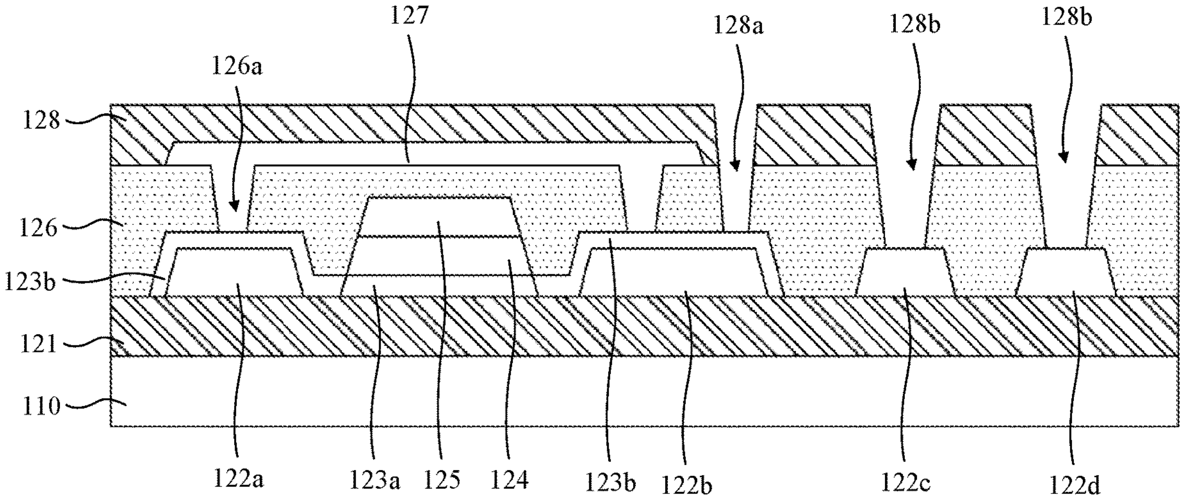

S60: forming a second active layer 127 on the interlayer insulating layer 126. As shown in FIG. 5E, the second active layer 127 can be disposed on one side of the interlayer insulating layer 126 away from the substrate 110, and two ends of the second active layer 127 are electrically connected to the first doped portions 123*b* through the first via holes 126*a*. A material of the second active layer 127 in this embodiment can be the same as the material of the first active layer 123.

S70: forming a second gate insulating layer 128 on the second active layer 127.

In the present embodiment, as shown in FIG. 5E, the second gate insulating layer 128 can be disposed on one side of the second active layer 127 away from the substrate 110. The second gate insulating layer 128 is used to isolate the upper metal layers from the second active layer 127.

A material of the second gate insulating layer 128 in this embodiment can be a compound composed of nitrogen, silicon, and oxygen. In this embodiment, the second gate insulating layer 128 covers the second active layer 127 and portions of the interlayer insulating layer 126 that are not covered by the second active layer 127.

In the present embodiment, a plurality of second via holes 128*a* are formed in the second gate insulating layer 128. The second via hole 128*a* is used to partially expose the first doped portion 123*b* on the drain contact portion 122*b*. The second via hole 128*a* penetrates through the second gate insulating layer 128 and through a portion of the interlayer insulation layer 126. In addition to that, during the formation of the second via hole 128*a*, the material of the second gate insulating layer 128 in the transition holes 126*b* can be removed.

In the present embodiment, during the process of forming the first via holes 126*a*, it is possible to skip the process of forming the transition holes 126*b*. This means that during the process of forming the second via holes 128*a*, multiple third via holes 128*b* can be simultaneously formed to partially expose the first connection terminal 122*c* and the second connection terminal 122*d*.

S80: forming a second gate 129*a* and a pixel electrode 129*b* on the second gate insulating layer 128.

Figure 5F:
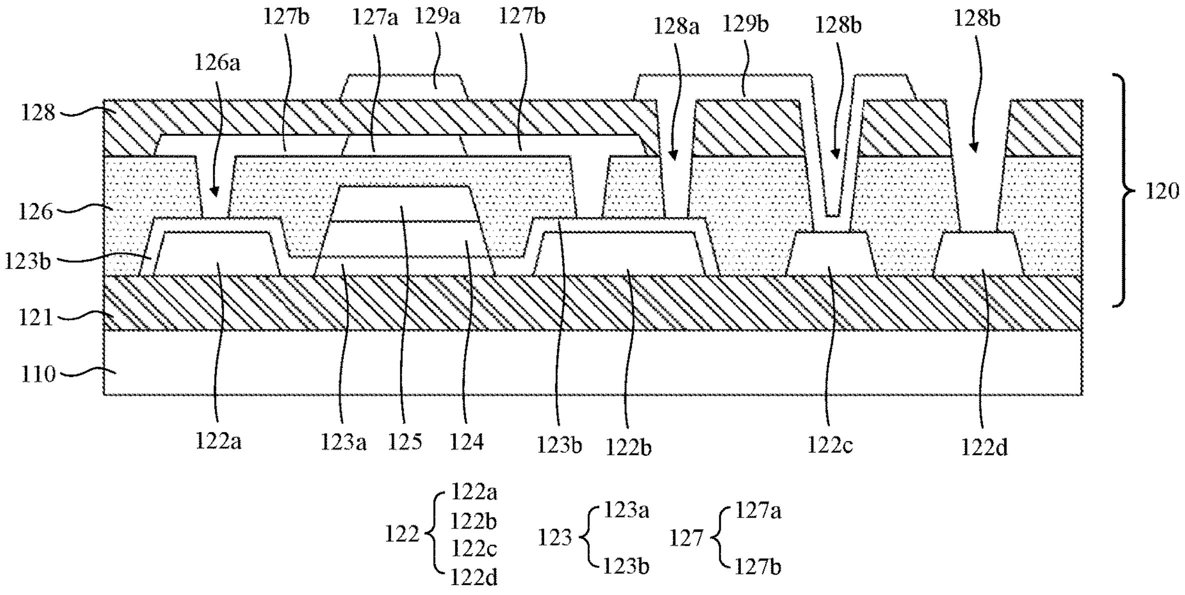

As shown in FIG. 5F, the second gate 129*a* and the pixel electrode 129*b* can both be positioned on one side of the second gate insulating layer 128 away from the substrate 110. The second gate 129*a* and the pixel electrode 129*b* can be formed in the same manufacturing step. Additionally, the second gate 129*a* and the pixel electrode 129*b* can be made from the same material, such as transparent metal materials like indium tin oxide (ITO).

In the present embodiment, the second gate 129*a* serves as a masking layer, and ion implantation is performed on the second active layer 127, resulting in the formation of the second channel portion 127*a* and the second doped portions 127*b* on two sides of the second channel portion 127*a*.

In the present embodiment, a pattern of the second gate 129*a* matches a pattern of the second gate insulating layer 128, and the second gate 129*a* is disposed corresponding to the second channel portion 127*a*. In other words, an orthographic projection of the second channel portion 127*a* projected on the second gate 129*a* is within the second gate 129*a*, thus protecting the second channel portion 127*a* from external light interference.

In the present embodiment, the pixel electrode 129*b* is electrically connected to the first doped portion 123*b* on the drain contact portion 122*b* via the second via hole 128*a*. Additionally, one end of the pixel electrode 129*b* extends into the third via hole and is electrically connected to the first connection terminal 122*c*.

In the present embodiment, the light-emitting devices can be any of LED, MiniLED, or MicroLED.

In subsequent steps, to ensure the uniformity of the light-emitting backplane, a light-shielding adhesive can be applied to the array substrate 100 to cover the array substrate 100 except the light-emitting devices.

Furthermore, in the structure shown in FIG. 1, the process for forming the first connection terminal 122*c* and the second connection terminal 122*d* can be omitted during the fabrication of the source-drain layer 122. As for the structure shown in FIG. 3, during the fabrication of the source-drain layer 122, an electrical connecting component 122*e* can be formed to connect the drain contact portion 122*b* to the first connection terminal 122*c*, and the process for forming the pixel electrode 129*b* and the second via hole 128*a* can be omitted.

The present application also discloses a mobile terminal, which includes a terminal body and the aforementioned display panel. The terminal body and the display panel are integrated as a single unit. The terminal body may be a device such as a circuit board bound to the display panel and a cover plate provided on the display panel. The mobile terminal may include electronic devices such as mobile phones, televisions, and laptops.

The present application discloses an array substrate, a manufacturing method thereof, as well as a display panel. The array substrate includes a substrate, a first active layer, a source-drain layer, a first gate, a second active layer, and a second gate stacked one above the other. The first active layer includes a first channel portion disposed corresponding to the first gate. The second active layer includes a second channel portion disposed corresponding to the second gate. The first active layer and the second active layer are connected in parallel. The first channel portion and the second channel portion are separated from each other. The source-drain layer and the first channel portion are arranged on the surface of a same layer. The first active layer directly contacts the source contact portion and the drain contact portion of the source-drain layer. By placing the source-drain layer and the first channel portion on the surface of the same layer, this application omits an insulating layer between the source-drain layer and the first active layer. Through direct contact between the first active layer and the source-drain layer's source contact portion and drain contact portion, the present application eliminates a need for contact holes between the first active layer and the source-drain layer, thus simplifying the manufacturing process of the array substrate.

In the above embodiments, each embodiment is described with its own emphasis. For those that are not described in detail in a certain embodiment, please refer to the relevant descriptions of other embodiments.

The above is a detailed description for an array substrate, a manufacturing method thereof, and a display panel provided by the present application. Specific examples are used in this disclosure to illustrate the principles and implementation methods of the present application. The description of the above embodiments is only for ease of understanding the technical solutions and the core ideas of this application. Those of ordinary skill in the art can modify the technical solutions in the foregoing embodiments, or equivalently replace some of the technical features. However, these modifications or replacements do not cause the essence of the corresponding technical solutions to depart from the scope of the technical solutions of the embodiments of the present application.

What is claimed is:

1. An array substrate, comprising:

a substrate;

a first active layer disposed on the substrate and comprising a first channel portion, wherein the first active layer comprises two first doped portions disposed on two sides of the first channel portion;

a source-drain layer disposed on the substrate, wherein the source-drain layer and the first channel portion are disposed on a surface of a same layer, and the source-drain layer comprises a source contact portion and a drain contact portion separated from each other, wherein the first channel portion is disposed between the source contact portion and the drain contact portion, and the two first doped portions make electrical contact with the source contact portion and the drain contact portion, respectively;

a first gate disposed on one side of the first active layer away from the substrate, wherein the first gate is disposed corresponding to the first channel portion;

a second active layer disposed on one side of the first gate away from the substrate, wherein the second active layer comprises a second channel portion, and the first channel portion and the second channel portion are separated from each other, wherein the second active layer comprises two second doped portions disposed on two sides of the second channel portion, and the second doped portions are electrically connected to the respectively corresponding first doped portions through first via holes, wherein an ion concentration of the first doped portion is greater than an ion concentration of the second doped portion; and a second gate disposed on one side of the second active layer away from the substrate, wherein the second gate is disposed corresponding to the second channel portion;

wherein the first active layer and the second active layer are connected in parallel, and the first active layer directly contacts the source contact portion and the drain contact portion.

2. The array substrate according to claim 1, wherein a length of the first channel portion is greater than a length of the second channel portion.

3. The array substrate according to claim 1, further comprising a pixel electrode, wherein the pixel electrode and the second gate are disposed on a surface of a same layer, and wherein the pixel electrode is electrically connected to the first doped portion on the drain contact portion through a second via hole.

4. The array substrate according to claim 3, wherein in a direction from the source contact portion to the drain contact portion, a width of the source contact portion is less than a width of the drain contact portion.

5. The array substrate according to claim 3, wherein the source-drain layer further comprises a first connection terminal and a second connection terminal, and the first connection terminal and the second connection terminal are disposed on one side of the drain contact portion away from the first channel portion; and the array substrate further comprises a third via hole arranged corresponding to the first connection terminal, and one end of the pixel electrode extends into the third via hole and is electrically connected to the first connection terminal.

6. The array substrate according to claim 1, wherein the source-drain layer further comprises a first connection terminal and a second connection terminal, and the first connection terminal and the second connection terminal are disposed on one side of the drain contact portion away from the first channel portion; and the source-drain layer further comprises an electrical connecting component disposed between the drain contact portion and the first connection terminal, and the drain contact portion and the first connection terminal are electrically connected through the electrical connecting component.

7. The array substrate according to claim 1, wherein in a direction from the source contact portion to the drain contact portion, a length of the first channel portion is less than or equal to a width of the first gate.

8. A display panel, comprising the array substrate as claimed in claim 1 and a light-emitting component disposed on one side of the array substrate, wherein the array substrate and the light-emitting component are combined into a single unit.

9. The display panel according to claim 8, wherein the first active layer comprises two first doped portions disposed on two sides of the first channel portion; the second active layer comprises two second doped portions disposed on two sides of the second channel portion; the first channel portion is disposed between the source contact portion and the drain contact portion; the two first doped portions make electrical contact with the source contact portion and the drain contact portion, respectively; and the second doped portions are electrically connected to the respectively corresponding first doped portions through first via holes.

10. The display panel according to claim 9, wherein an ion concentration of the first doped portion is greater than an ion concentration of the second doped portion.

11. The display panel according to claim 10, wherein a length of the first channel portion is greater than a length of the second channel portion.

12. The display panel according to claim 9, further comprising a pixel electrode, wherein the pixel electrode and the second gate are disposed on a surface of a same layer, and wherein the pixel electrode is electrically connected to the first doped portion on the drain contact portion through a second via hole.

13. The display panel according to claim 12, wherein in a direction from the source contact portion to the drain contact portion, a width of the source contact portion is less than a width of the drain contact portion.

14. The display panel according to claim 12, wherein the source-drain layer further comprises a first connection terminal and a second connection terminal, and the first connection terminal and the second connection terminal are disposed on one side of the drain contact portion away from the first channel portion; and the array substrate further comprises a third via hole arranged corresponding to the first connection terminal, and one end of the pixel electrode extends into the third via hole and is electrically connected to the first connection terminal.

15. The display panel according to claim 9, wherein the source-drain layer further comprises a first connection terminal and a second connection terminal, and the first connection terminal and the second connection terminal are disposed on one side of the drain contact portion away from the first channel portion; and the source-drain layer further comprises an electrical connecting component disposed between the drain contact portion and the first connection terminal, and the drain contact portion and the first connection terminal are electrically connected through the electrical connecting component.

16. The display panel according to claim 9, wherein in a direction from the source contact portion to the drain contact portion, a length of the first channel portion is less than or equal to a width of the first gate.

17. An array substrate, comprising:

a substrate;

a first active layer disposed on the substrate and comprising a first channel portion, wherein the first active layer comprises two first doped portions disposed on two sides of the first channel portion;

a source-drain layer disposed on the substrate, wherein the source-drain layer and the first channel portion are disposed on a surface of a same layer, and the source-drain layer comprises a source contact portion and a drain contact portion separated from each other, wherein the first channel portion is disposed between the source contact portion and the drain contact portion, and the two first doped portions make electrical contact with the source contact portion and the drain contact portion, respectively;

a first gate disposed on one side of the first active layer away from the substrate, wherein the first gate is disposed corresponding to the first channel portion;

a second active layer disposed on one side of the first gate away from the substrate, wherein the second active layer comprises a second channel portion, and the first channel portion and the second channel portion are separated from each other, wherein the second active layer comprises two second doped portions disposed on two sides of the second channel portion, the second doped portions are electrically connected to the respectively corresponding first doped portions through first via holes, wherein an ion concentration of the first doped portion is greater than an ion concentration of the second doped portion and a length of the first channel portion is greater than a length of the second channel portion; and a second gate disposed on one side of the second active layer away from the substrate, wherein the second gate is disposed corresponding to the second channel portion;

wherein the first active layer and the second active layer are connected in parallel, and the first active layer directly contacts the source contact portion and the drain contact portion.

18. The array substrate according to claim 17, further comprising a pixel electrode, wherein the pixel electrode and the second gate are disposed on a surface of a same layer, and wherein the pixel electrode is electrically connected to the first doped portion on the drain contact portion through a second via hole.

19. The array substrate according to claim 17, wherein in a direction from the source contact portion to the drain contact portion, a width of the source contact portion is less than a width of the drain contact portion.

20. The array substrate according to claim 17, wherein in a direction from the source contact portion to the drain contact portion, a length of the first channel portion is less than or equal to a width of the first gate.

* * * * *